United States Patent
Yellin et al.

(10) Patent No.: US 7,240,265 B1
(45) Date of Patent: Jul. 3, 2007

(54) APPARATUS FOR USE IN DETECTING CIRCUIT FAULTS DURING BOUNDARY SCAN TESTING

(75) Inventors: Carmy Yellin, Los Angeles, CA (US); Menachem Blasberg, Brea, CA (US)

(73) Assignee: Corelis, Inc., Cerritos, CA (US)

( * ) Notice: Subject to any disclaimer, the term of this patent is extended or adjusted under 35 U.S.C. 154(b) by 525 days.

(21) Appl. No.: 10/424,560

(22) Filed: Apr. 28, 2003

(51) Int. Cl.
*G01R 31/28* (2006.01)
(52) U.S. Cl. .................. 714/727; 714/724
(58) Field of Classification Search ........... 714/726, 714/727, 729
See application file for complete search history.

(56) References Cited

U.S. PATENT DOCUMENTS

| | | | |
|---|---|---|---|
| 5,513,188 A * | 4/1996 | Parker et al. ......... | 714/727 |
| 5,726,997 A * | 3/1998 | Teene ......... | 714/726 |
| 6,163,867 A * | 12/2000 | Miller et al. ......... | 714/736 |
| 6,591,211 B1 * | 7/2003 | Schnarch ......... | 702/108 |
| 6,658,613 B2 * | 12/2003 | Rearick et al. ......... | 714/724 |
| 6,766,486 B2 * | 7/2004 | Neeb ......... | 714/724 |
| 7,036,055 B2 * | 4/2006 | Muljono et al. ......... | 714/716 |

* cited by examiner

*Primary Examiner*—James C. Kerveros
(74) *Attorney, Agent, or Firm*—Law Offices of John C. Scott, LLC

(57) ABSTRACT

A boundary scan compatible device includes functionality for use in diagnosing the presence of bridging faults within associated circuitry. In at least one embodiment, a boundary scan compatible device includes functionality for detecting an intermediate signal level on an electrical node of the device (e.g., a pin on a circuit package, etc.) that is indicative of a bridging fault. Various structures are provided that are capable of detecting an intermediate signal level.

10 Claims, 19 Drawing Sheets

APPARATUS FOR USE IN DETECTING CIRCUIT FAULTS DURING BOUNDARY SCAN TESTING

FIELD OF THE INVENTION

The invention relates generally to circuit testing and, more particularly, to techniques and structures for use in performing boundary scan testing.

BACKGROUND OF THE INVENTION

Printed circuit board testing has traditionally been performed using bed-of-nails in-circuit test equipment. This equipment typically includes a test fixture having a multitude of test probes (known as a "bed of nails") that, when coupled to a circuit board, simultaneously contacts numerous electrical nodes on the circuit board, thereby providing electrical access to the components on the board. Various electrical tests may then be performed on the circuit components, usually under computer control. For various reasons, it is becoming increasingly difficult to perform in-circuit testing using a "bed-of-nails" approach. For example, integrated circuits (ICs) are getting smaller and IC packages are using finer and finer lead pitches making it difficult to contact all of the desired nodes in the circuit with a bed-of-nails. Also, many ICs are using packages that have an array of leads on a single side thereof (e.g., ball grid arrays, pin grid arrays, etc.) that are inaccessible to a bed-of-nails once the IC has been attached to the circuit board.

To overcome many of the problems associated with traditional in-circuit testing, boundary scan testing has been developed. Boundary scan is a technique that incorporates additional hardware into electrical devices that allows the pins of the devices to be accessed and tests to be performed without the use of a bed-of-nails type fixture. Boundary scan techniques can allow controllability and observability of the boundary pins of one or more compatible devices in a circuit or system via software control. Although boundary scan techniques have proven successful and are very popular, they are not currently capable of reliably identifying bridging faults in circuits. Therefore, there is a need for techniques and structures that are capable of increasing the reliability with which bridging faults are detected in circuits and/or systems having boundary scan compatible devices.

DETAILED DESCRIPTION

Figure 1:
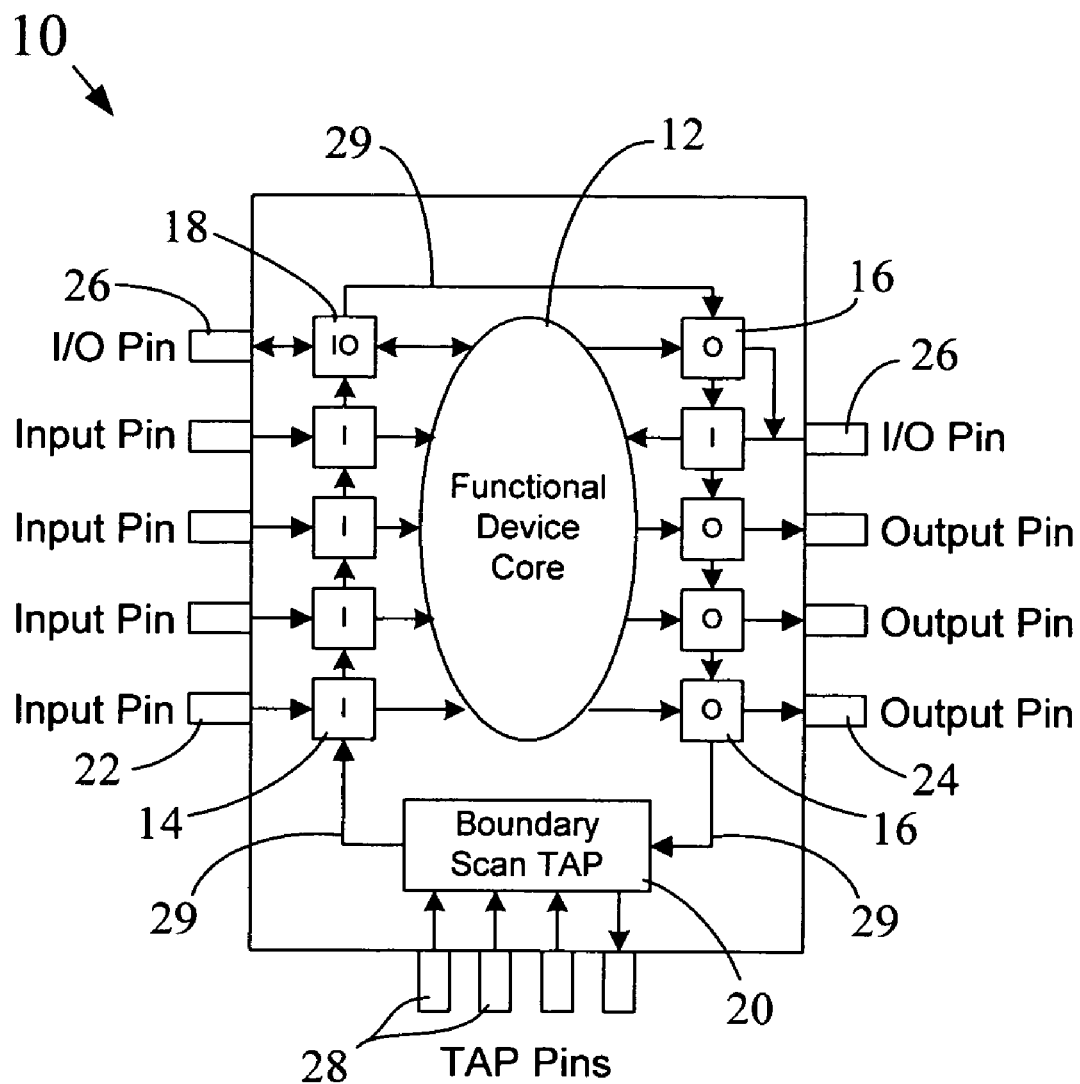
FIG. 1 is a block diagram illustrating an example of a boundary scan compatible device.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram illustrating a digital device 10 that is boundary scan compatible. As shown, the device 10 includes: a functional device core 12, a plurality of boundary scan (BS) cells including BS input cells 14, BS output cells 16, and bi-directional BS cells 18, a boundary scan test access port (TAP) 20, a plurality of pins including input pins 22, output pins 24, and bi-directional pins 26 on a package of the device 10, and a plurality of TAP pins 28. The functional device core 12 is the portion of the device 10 that performs the functions that the device 10 was designed to perform during normal operation. As will be described in greater detail, the BS cells are hardware elements within the device 10 that allow the device 10, and possibly other devices and/or structures coupled thereto, to be tested by an external boundary scan tester (e.g., a remote TAP control device executing test software). The BS cells 14, 16, 18 are coupled between the pins of the device 10 and the functional device core 12 and thus may be used to control, for example, inputs to the functional device core 12 as well as outputs from the device 10.

The boundary scan TAP 20 is a hardware element within the device 10 that is capable of communicating with the external boundary scan tester through the TAP pins 28 and which may control the testing mode and other boundary scan functions within the device 10. Each of the boundary scan cells 14, 16, 18 may include a data storage element (e.g., a memory cell, etc.) that is capable of storing, for example, test data. The boundary scan TAP 20 may shift data into and out of a chain of BS cells through a serial line 29 connecting the cells. The BS input cells 14 may be used to apply input test data to the functional device core 12 through computer control. The BS input cells 14 may also (or alternatively) be used to receive test data from a corresponding input pin 22 or bi-directional pin 26. The BS output cells 16 may be used to deliver output test data to the output pins 24 or bi-directional pins 26 of the device 10 through computer control. During normal device operation (i.e., not during BS testing), the BS cells 14, 16, 18 may appear as pass-through elements between the pins 22, 24, 26 and the functional device core 12. It should be appreciated that the device 10 of FIG. 1 is simply an example of one possible configuration within a boundary scan compatible device.

Figure 2:
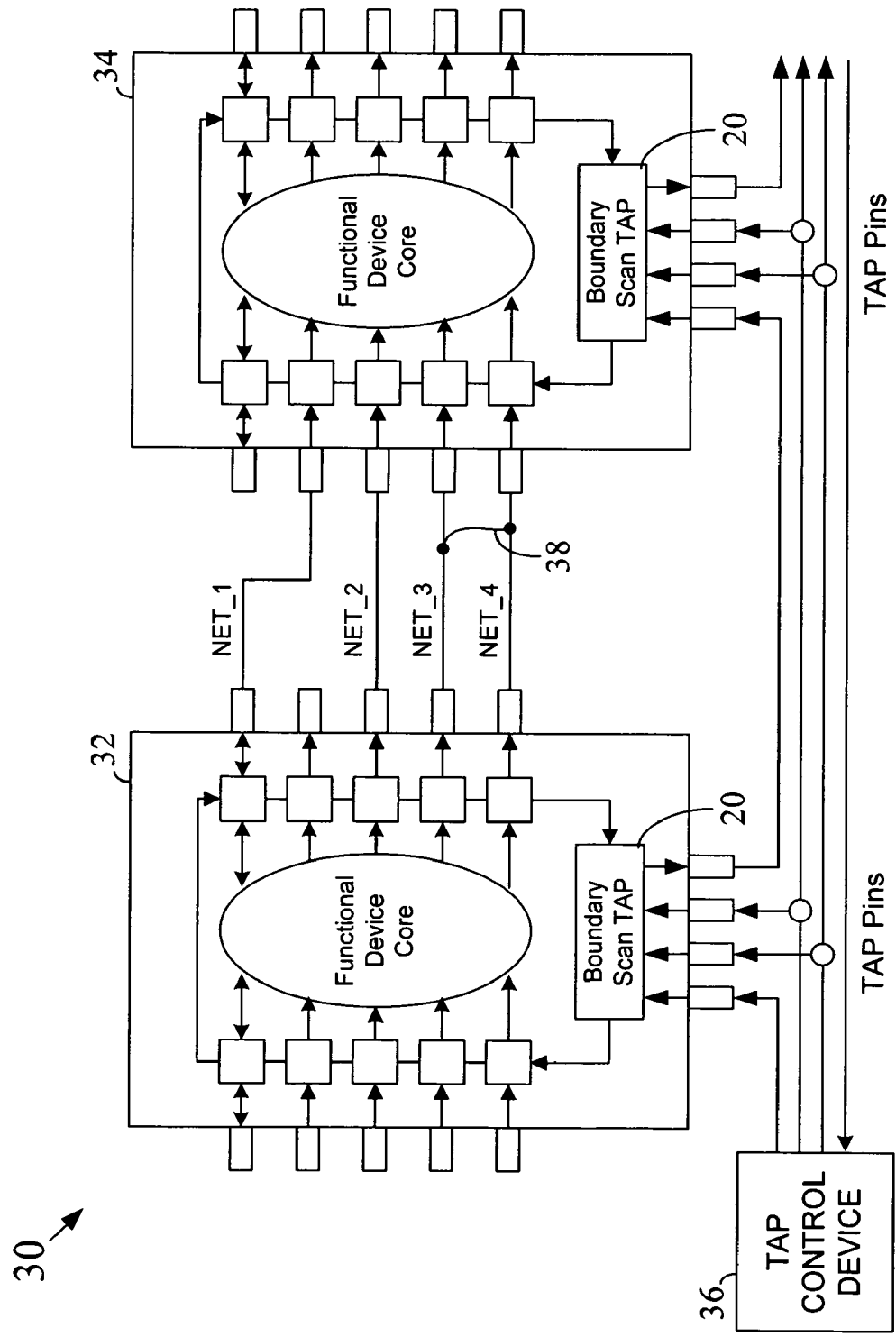
FIG. 2 is a block diagram illustrating an electrical system having multiple boundary scan compatible devices connected together.

FIG. 2 is a block diagram illustrating an electrical system 30 having multiple boundary scan compatible devices connected together. As illustrated, various output pins or input/output pins of a first device 32 are coupled to input pins of a second device 34 through interconnections known as nets (i.e., NET_1, NET_2, NET_3, NET_4 in the illustrated structure). Although not shown, other boundary scan compatible devices and other non-compatible devices may also be part of the electrical system 30. An external TAP control device 36 is coupled to the boundary scan TAP 20 of each of the boundary scan compatible devices 32, 34 to control the testing of the electrical system 30. Any number of boundary scan compatible devices may be connected together in this fashion. As shown in FIG. 2, an inadvertent short known as a bridging fault 38 may occur between two nets within an electrical system (or between a net and power or ground). The existence of such a bridging fault will often result in non-deterministic signal levels within an electrical system that do not allow the location and nature of the fault to be reliably detected using traditional boundary scan techniques and structures. The present invention relates to techniques and structures that are capable of increasing the reliability with which bridging faults may be detected and diagnosed during boundary scan testing.

In a digital system, data may be represented as binary data bits that are either a logic one or a logic zero (digital systems that use more than two logic levels also exist). A logic one is typically represented by a first voltage and a logic zero by a second voltage. To detect a data bit, a receiver may measure the voltage level on a corresponding line and determine whether the voltage level represents a logic one or a logic zero. In a conventional CMOS receiver, for example, a threshold voltage is typically selected that is half way between the voltage level representative of a logic one and the voltage level representative of a logic zero. The CMOS receiver compares the measured voltage to the threshold value and, if the measured value is greater than the threshold, the bit is determined to be a logic one and, if the measured value is smaller than the threshold, the bit is determined to be a logic zero (or vice versa). Bridging faults will often lead to situations where signal levels (e.g., voltage levels, etc.) are not clearly associated with logic ones or logic zeros but, instead, are non-deterministic. For example, signal levels may be within a gray area between the logic zero and logic one values. In accordance with at least one aspect of the present invention, structures are provided within boundary scan compatible devices and/or systems that allow such signal levels to be detected and analyzed for use in identifying and diagnosing bridging faults.

Figure 3:
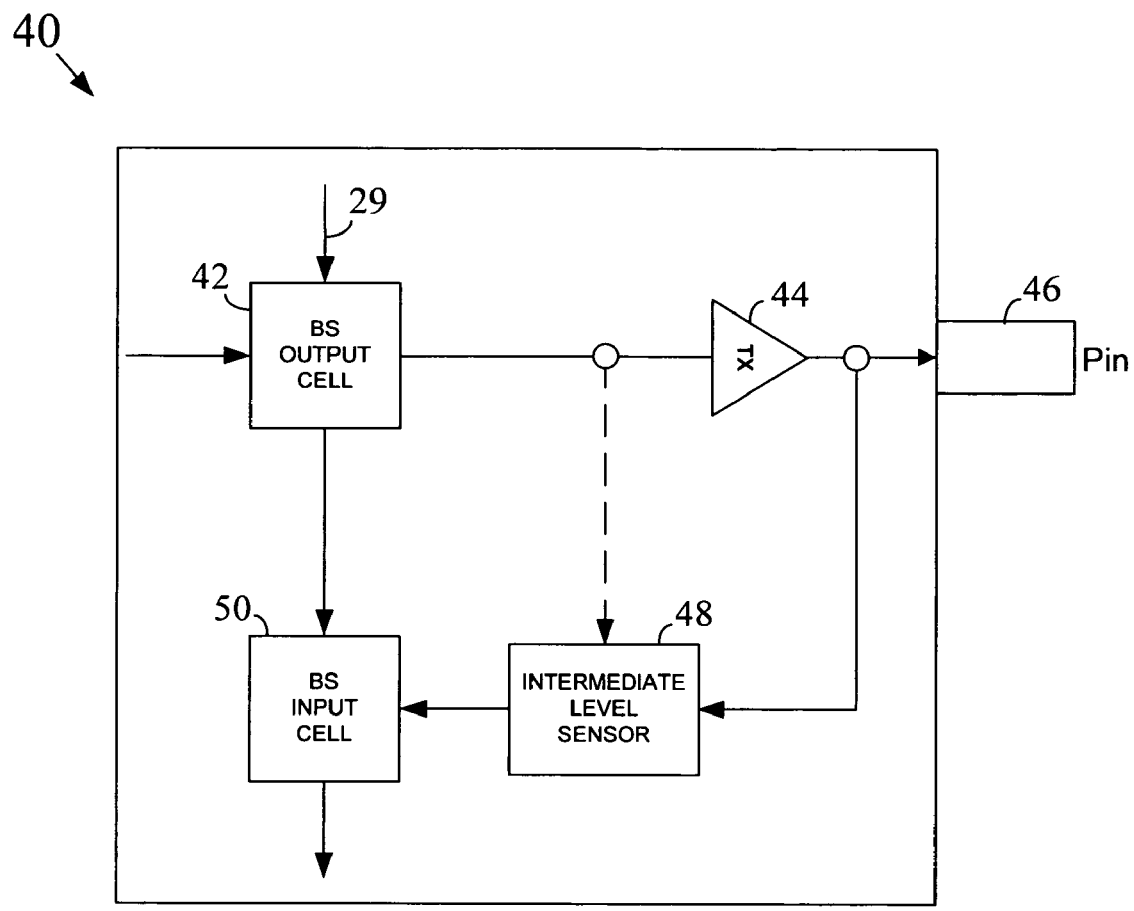
FIG. 3 is a block diagram illustrating a boundary scan output pin arrangement in accordance with an embodiment of the present invention.

FIG. 3 is a block diagram illustrating a boundary scan output pin arrangement 40 in accordance with an embodiment of the present invention. As illustrated, the arrangement 40 includes: a BS output cell 42, a transmitter (driver) 44, an output (or bi-directional) pin 46, an intermediate level sensor 48, and a boundary scan input cell 50. The transmitter 44 is operative for driving the output pin 46 based on the output of the BS output cell 42. The transmitter 44 may include, for example, a digital buffer or driver. The intermediate level sensor 48 monitors the signal level on the output pin 46 and determines whether the level falls within an intermediate range that is not in harmony with a digital data value. The range that is used may depend upon the digital data value (e.g., a logic zero or a logic one in a binary system) that is being transmitted (i.e., the value being output by the BS output cell 42). For example, if a logic one is being transmitted, the range may include all signal levels that are below a first threshold value. Similarly, if a logic zero is being transmitted then the range may include all signal levels that are above a second threshold value that is different from the first. In an alternative approach, the intermediate range may be a range between a signal level indicative of a logic one and a signal level indicative of a logic. The intermediate level sensor 48 may be coupled to the output of the BS output cell 42 to obtain an indication of the appropriate level that the output pin 46 should be carrying. The intermediate level sensor 48 outputs an indication of whether the signal level on the output pin 46 falls within the intermediate range to the BS input cell 50. The data within the BS output cell 42 and the BS input cell 50 may then be shifted out and delivered to the external boundary scan tester for analysis.

Figure 4:
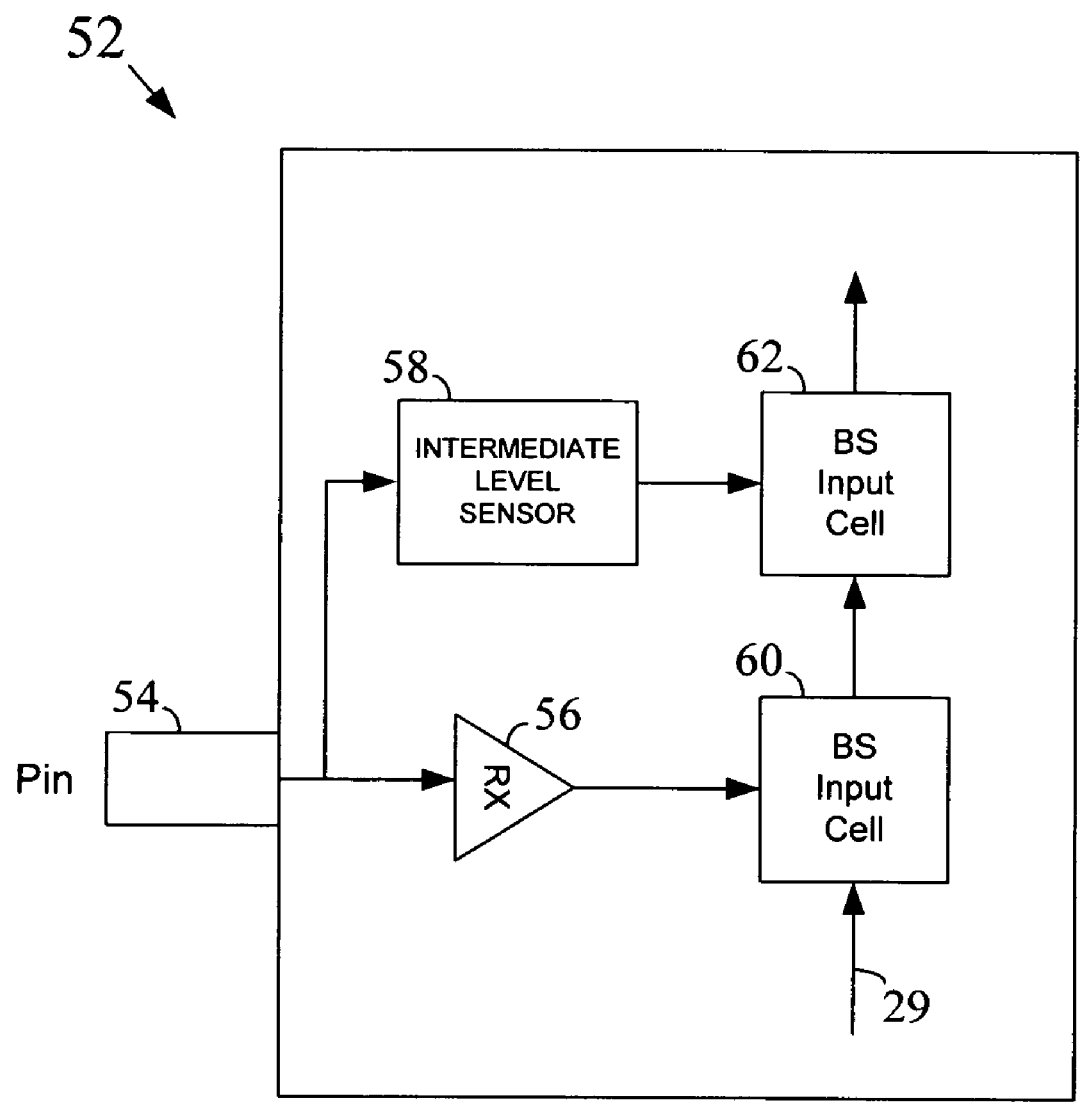
FIG. 4 is a block diagram illustrating a boundary scan input pin arrangement in accordance with an embodiment of the present invention.

FIG. 4 is a block diagram illustrating a boundary scan input pin arrangement 52 in accordance with an embodiment of the present invention. The input pin arrangement 52 includes: an input pin 54, a receiver 56, an intermediate level sensor 58, a first BS input cell 60, and a second BS input cell 62. The receiver 56 is operative for sensing the signal level on the input pin 54, determining whether the signal level represents a logic one or a logic zero, and delivering the corresponding data bit to the first BS input cell 60. The intermediate level sensor 58 determines whether the input signal level falls within an intermediate range that is not in harmony with a digital data value (i.e., a level that may signify the presence of a bridging fault) and outputs information to the second BS input cell 62 based on this determination. Although not shown, in at least one approach, the intermediate level sensor 58 may receive information from an external boundary scan tester as to the digital data value that was actually transmitted to the input pin 54. The intermediate level sensor 58 may use this information to select the intermediate range to use. The data within the first and second BS input cells 60, 62 may then be shifted out for analysis by the external boundary scan tester.

Figure 5:
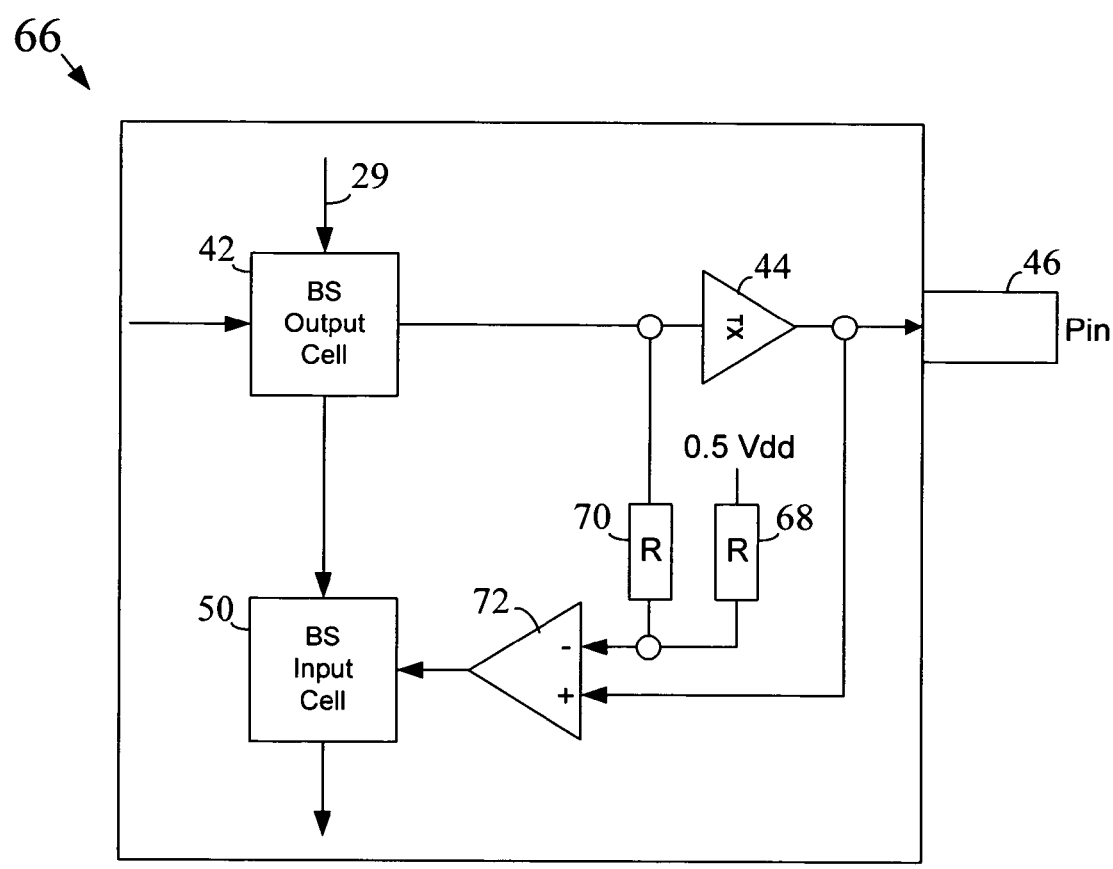
FIG. 5 is a block diagram illustrating a boundary scan output pin arrangement in accordance with another embodiment of the present invention.

FIG. 5 is a block diagram illustrating an output pin arrangement 66 in accordance with an embodiment of the present invention. As shown, the arrangement 66 includes: a BS output cell 42, a transmitter 44, an output pin 46, a BS input cell 50, first and second resistors 68, 70, and a comparator 72. The BS output cell 42, the transmitter 44, the output (or bi-directional) pin 46, and the BS input cell 50 operate in substantially the same manner described previously. The first resistor 68 is coupled between a voltage source supplying one half of a supply voltage Vdd and the inverting input of the comparator 72. The second resistor 70 is coupled between the output of the BS output cell 42 and the inverting input of the comparator 72. The first and second resistors 68, 70 have equal resistances. The output pin 46 is coupled to the non-inverting input of the comparator 72. When the BS output cell 42 outputs a logic one (e.g., ~Vdd), the comparator 72 compares the signal level on the output pin 46 to a threshold of 0.75Vdd and will detect the signal level as a logic one if the level is above this threshold and as a logic zero if the level is below this threshold. Similarly, when the BS output cell 42 outputs a logic zero (e.g., ~0 volts), the comparator 72 compares the signal level on the output pin 46 to a threshold of 0.25Vdd and will detect the signal level as a logic zero if the level is below this threshold and as a logic one if the level is above this threshold. Thus, the threshold for a logic one has been increased and the threshold for a logic zero has been decreased in a manner that makes it much more likely that a voltage anomaly caused by a bridging fault will be detected. The comparator 72 delivers the detected bit (or other intermediate signal level related information) to the BS input cell 50. The data within the BS output cell 42 and the BS input cell 50 may then be shifted out for analysis by the external boundary scan tester. It should be appreciated that the threshold values of 0.25 and 0.75 times the supply voltage are merely illustrative of values that may be used. Other threshold levels and/or resistor values and/or circuit arrangements may alternatively be used.

Figure 6:
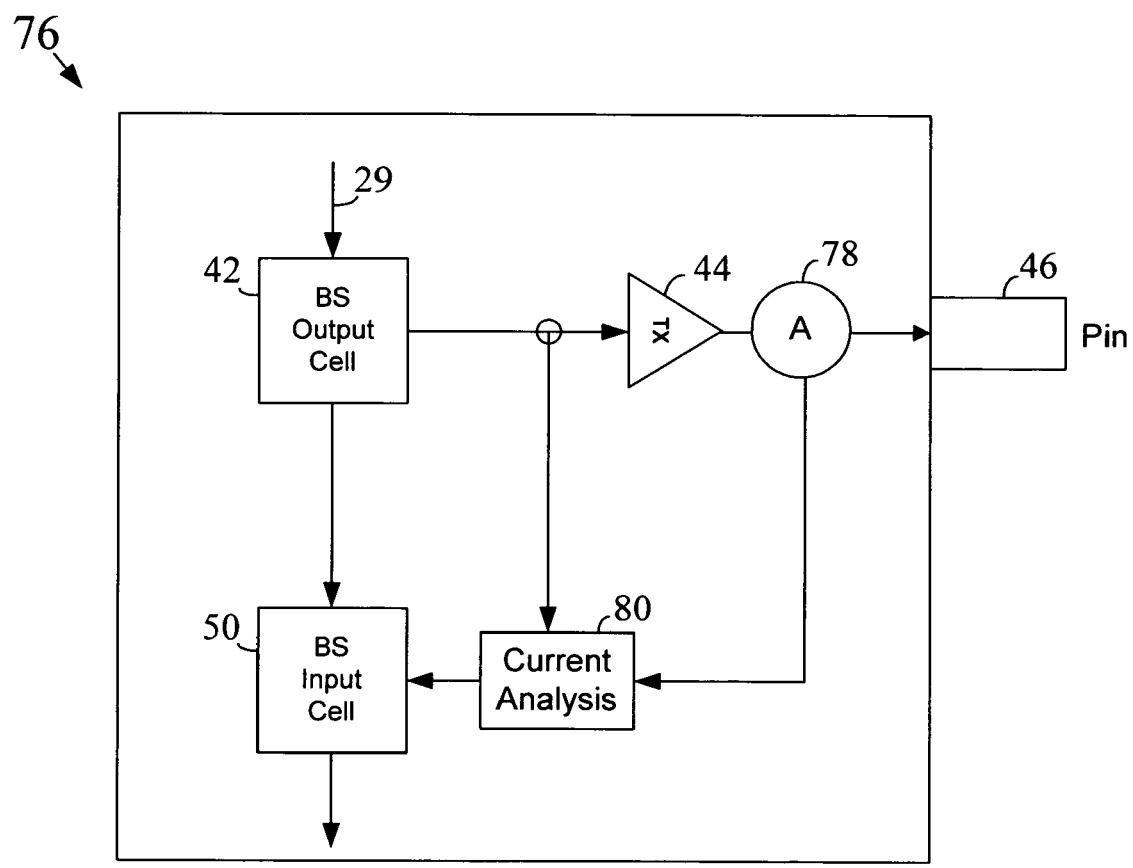
FIG. 6 is a block diagram illustrating a boundary scan output pin arrangement in accordance with another embodiment of the present invention.

FIG. 6 is a block diagram illustrating an output pin arrangement 76 in accordance with an embodiment of the present invention. As shown, the arrangement 76 includes: a BS output cell 42, a transmitter 44, an output pin 46, a BS input cell 50, a current measurement/current sense device 78, and a current analysis unit 80. The BS output cell 42, the transmitter 44, the output pin 46, and the BS input cell 50 operate as described previously. The current measurement device 78 is operative for measuring a signal current level being drawn from the transmitter 44 out through the output pin 46. The current measurement device 78 may include, for example, an ammeter, a resistor, or other similar device. The current analysis unit 80 analyzes the current measurement to determine whether the current is within an expected range for the data bit being driven. Currents outside of the expected range may signify the presence of a bridging fault. The current analysis unit 80 delivers information to the BS input cell 50 that is indicative of whether or not the measured current is within the expected range (e.g., a logic one if the current is within the expected range and a logic zero if not, etc.). The data within the BS output cell 42 and the BS input cell 50 may then be shifted out for analysis by the external boundary scan tester.

Figure 7:
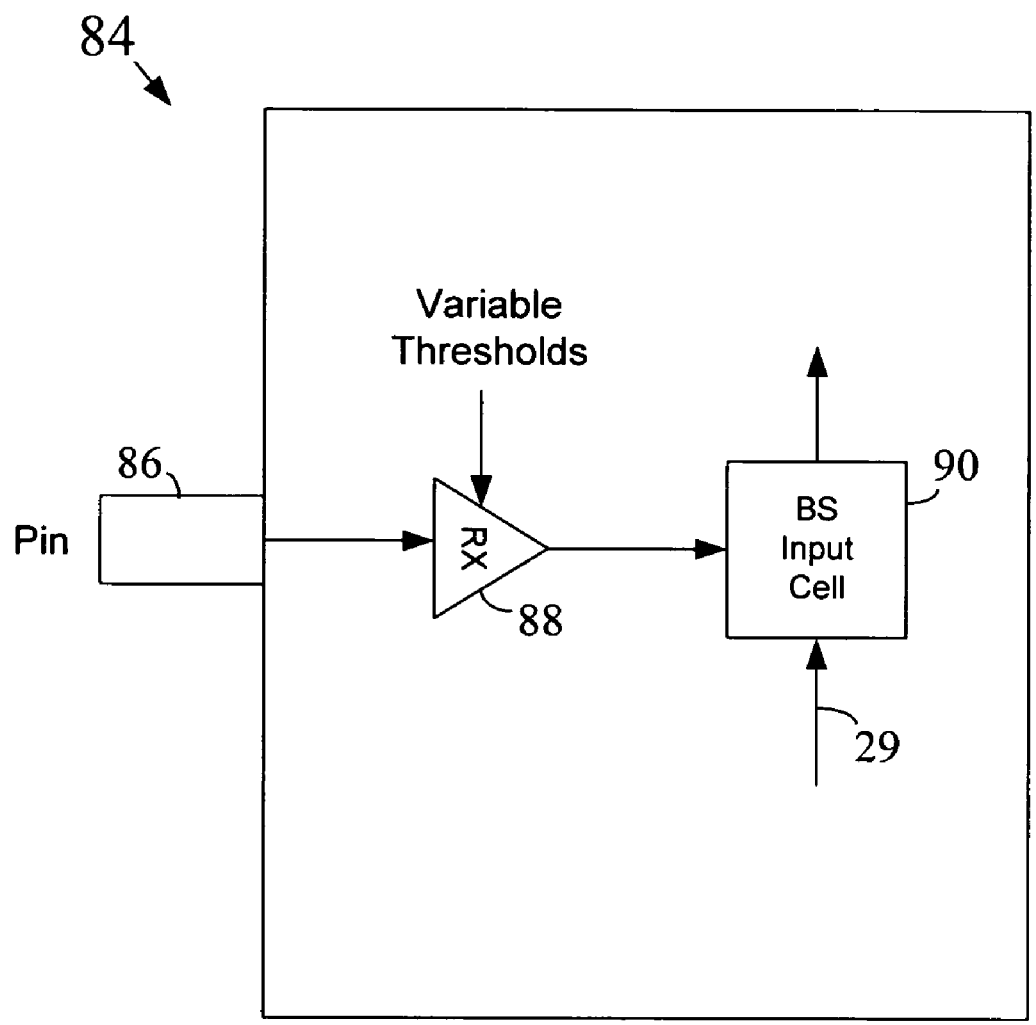
FIG. 7 is a block diagram illustrating a boundary scan input pin arrangement in accordance with another embodiment of the present invention.

FIG. 7 is a block diagram illustrating a BS input pin arrangement 84 in accordance with an embodiment of the present invention. As shown, the BS input pin arrangement 84 includes: an input pin 86, a receiver 88, and a BS input cell 90. The receiver 88 is operative for sensing a signal level on the input pin 86 and for determining whether the signal level is representative of a logic zero or a logic one. The receiver 88 then delivers the detected data bit to the BS input cell 90. As illustrated, the receiver 88 includes an input for receiving a variable threshold level. During normal device operation, a normal threshold level (or levels) may be delivered to the receiver 88 for detecting input data. For example, as described previously, a threshold that is halfway between the nominal level for a logic one and the nominal level for a logic zero may be used during normal operation. During boundary scan testing, however, modified threshold levels may be delivered to the receiver 88 for use in identifying bridging faults in the system. For example, a threshold level of 0.75Vdd may be used for the logic one threshold level and a threshold level of 0.25Vdd may be used for the logic zero threshold level during boundary scan testing. Other threshold levels may alternatively be used. The receiver 88 delivers the detected bit (or other intermediate signal level related information) to the BS input cell 90.

Figure 8:
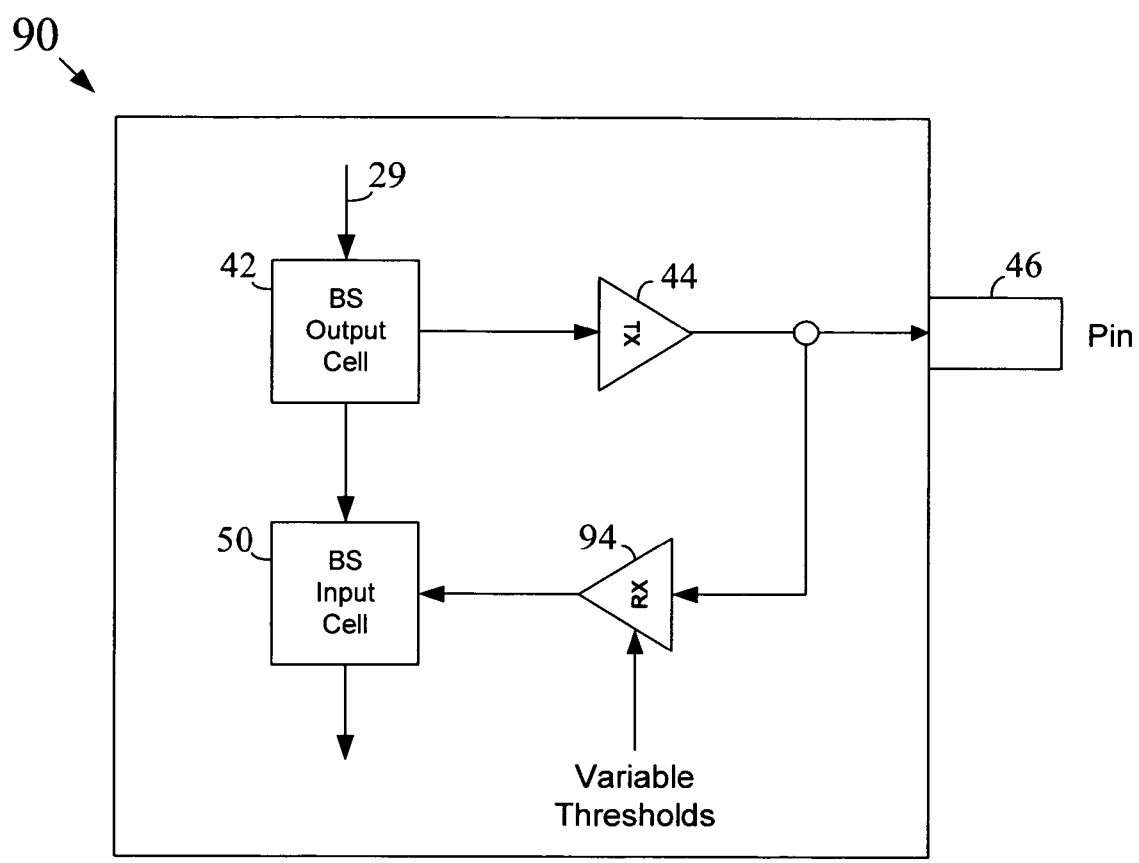
FIG. 8 is a block diagram illustrating a boundary scan output pin arrangement in accordance with another embodiment of the present invention.

In at least one approach, the same data bit is repeatedly delivered to the input pin 86 during testing while the threshold level used by the receiver 88 is varied. The resulting detected data bits are delivered to the BS input cell 90 and are subsequently shifted out to the external boundary scan tester for analysis. This approach allows the external boundary scan tester to estimate (measure) the actual voltage level of the received signal and to analyze this information to determine whether a bridging fault is likely. FIG. 8 is a block diagram illustrating a BS output pin arrangement 92 that includes a read back receiver 94 having an input for receiving a variable threshold level. Operation of the read back receiver 94 is similar to the receiver 88 discussed above in connection with FIG. 7.

Figure 9:
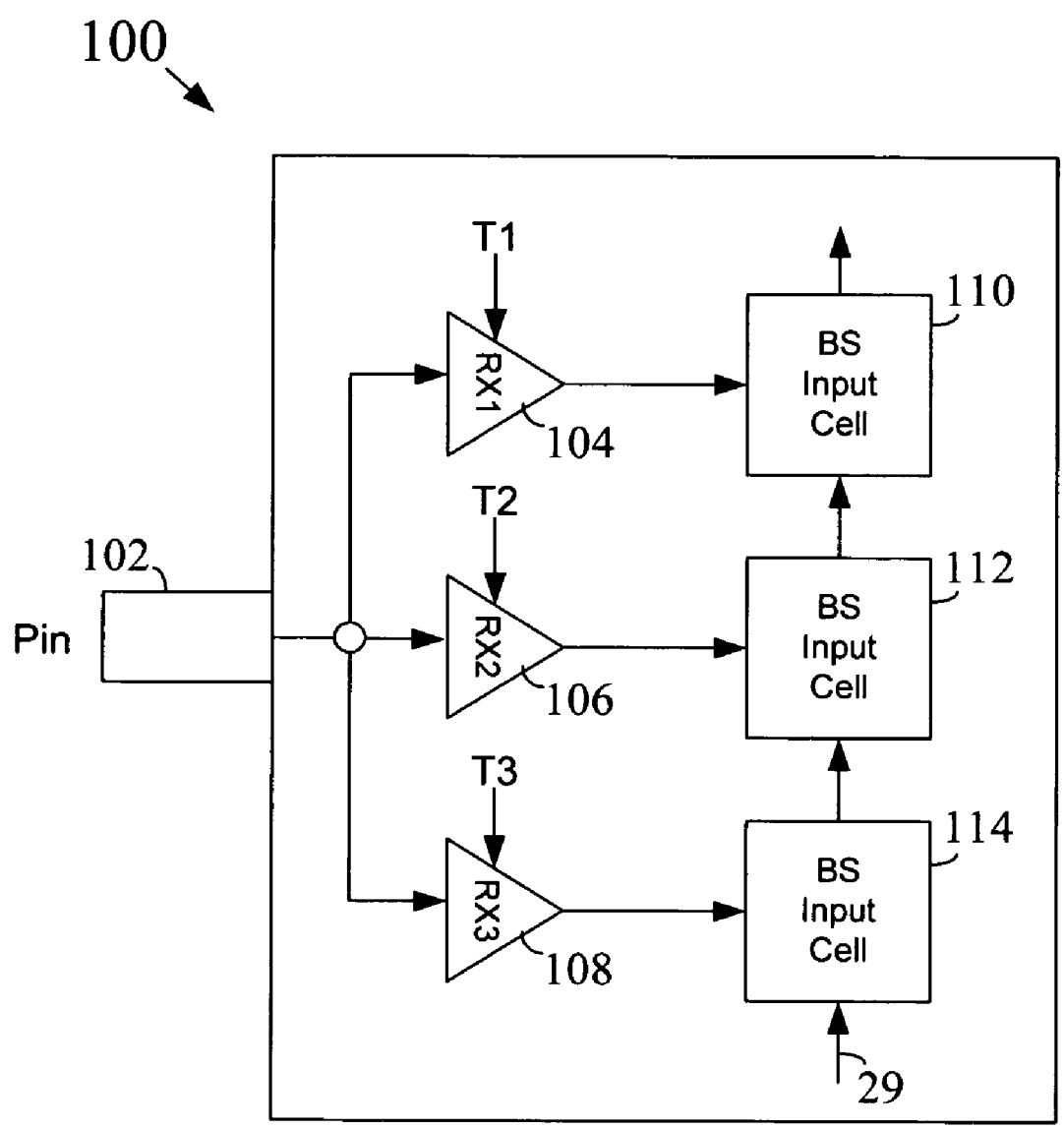
FIG. 9 is a block diagram illustrating a boundary scan input pin arrangement in accordance with another embodiment of the present invention.

FIG. 9 is a block diagram illustrating a BS input pin arrangement 100 in accordance with an embodiment of the present invention. As illustrated, the arrangement 100 includes: an input pin 102, first, second, and third receivers 104, 106, 108, and first, second, and third BS input cells 110, 112, 114. The first, second, and third receivers 104, 106, 108 each sense the signal level on the input pin 102. However, each of the receivers 104, 106, 108 uses a different threshold level (or levels) for detecting received data. One of the receivers (e.g., first receiver 104) may (or may not) use the threshold level that is used during normal device operation (e.g., a single threshold halfway between the logic one and logic zero signal level). One or more other receiver(s) (e.g., second and third receivers 106, 108) use thresholds that are selected to detect intermediate signal levels that may be indicative of the presence of a bridging fault. Each of the receivers 104, 106, 108 outputs detected data bits to a corresponding one of the first, second, and third BS input cells 110, 112, 114. The data within the first, second, and third BS input cells 110, 112, 114 may then be shifted out for analysis. Any number of receivers (i.e., two or greater) may be used in this manner.

Figure 10:
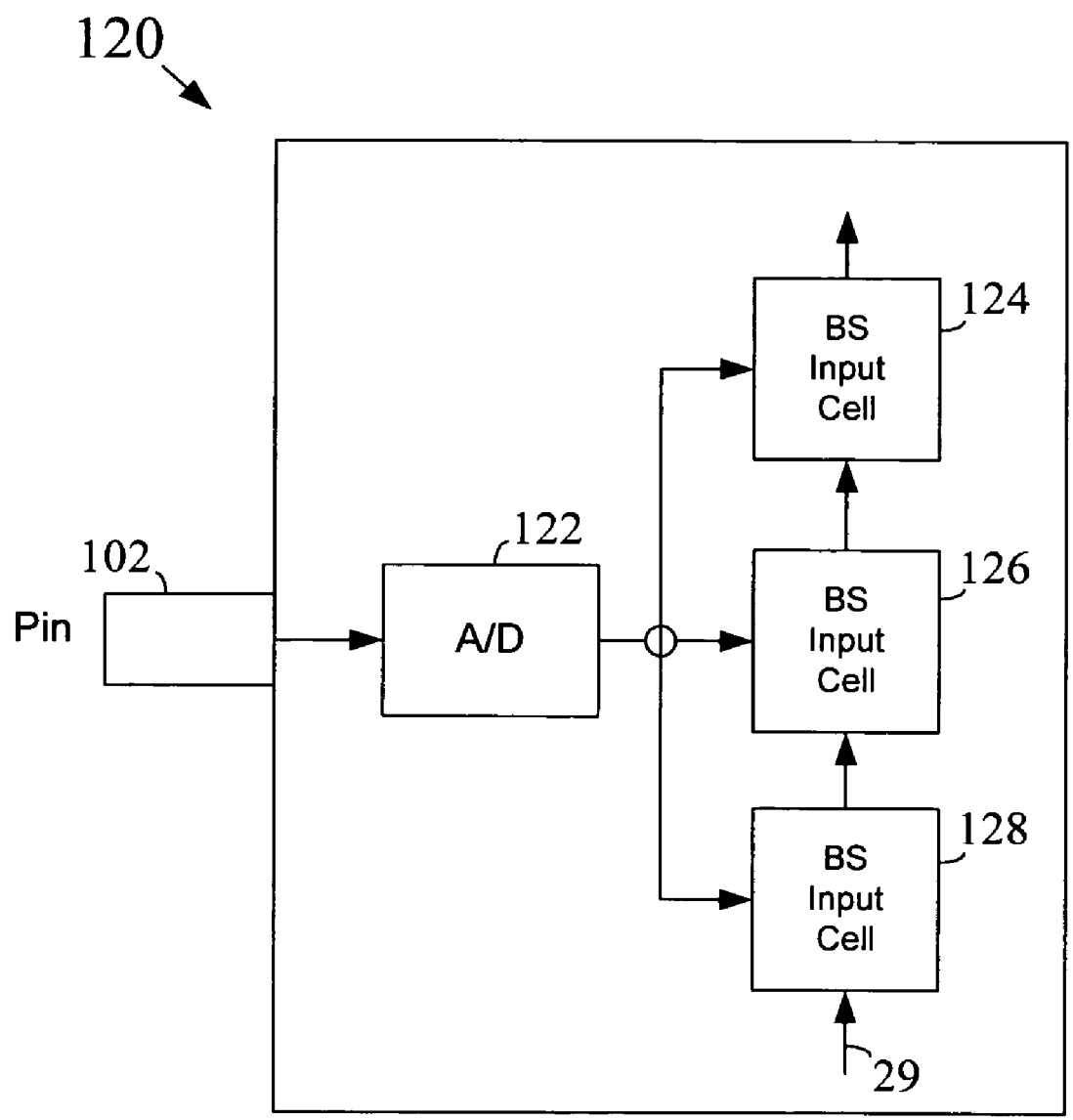
FIG. 10 is a block diagram illustrating a boundary scan input pin arrangement in accordance with another embodiment of the present invention.

FIG. 10 is a block diagram illustrating a BS input pin arrangement 120 in accordance with an embodiment of the present invention. As illustrated, the arrangement 120 includes: an input pin 102, an analog-to-digital (A/D) converter 122, and first, second, and third BS input cells 124, 126, 128. The A/D converter 122 senses the signal level on the input pin 102 and converts the level to a multi bit digital word. The A/D converter 122 then delivers each of the bits of the multi-bit word to a corresponding one of the first, second, and third BS input cells 124, 126, 128. This digital information may then be shifted out and analyzed by, for example, an external boundary scan tester. In at least one approach, the digital information is used by a boundary scan tester to get an indication of the actual analog level of the received signal for use in determining whether a bridging fault is present (e.g., by determining whether an intermediate signal level is present). The multi-bit digital word generated by the A/D converter 122 may have any number of digital data bits (i.e., two or greater) with a corresponding BS input cell for each bit (or a serial A/D can be used where multiple bits are read out serially). The BS input pin arrangement 120 may also have a separate receiver and BS input cell coupled to the pin 102 for use during normal device operation.

Figure 11:
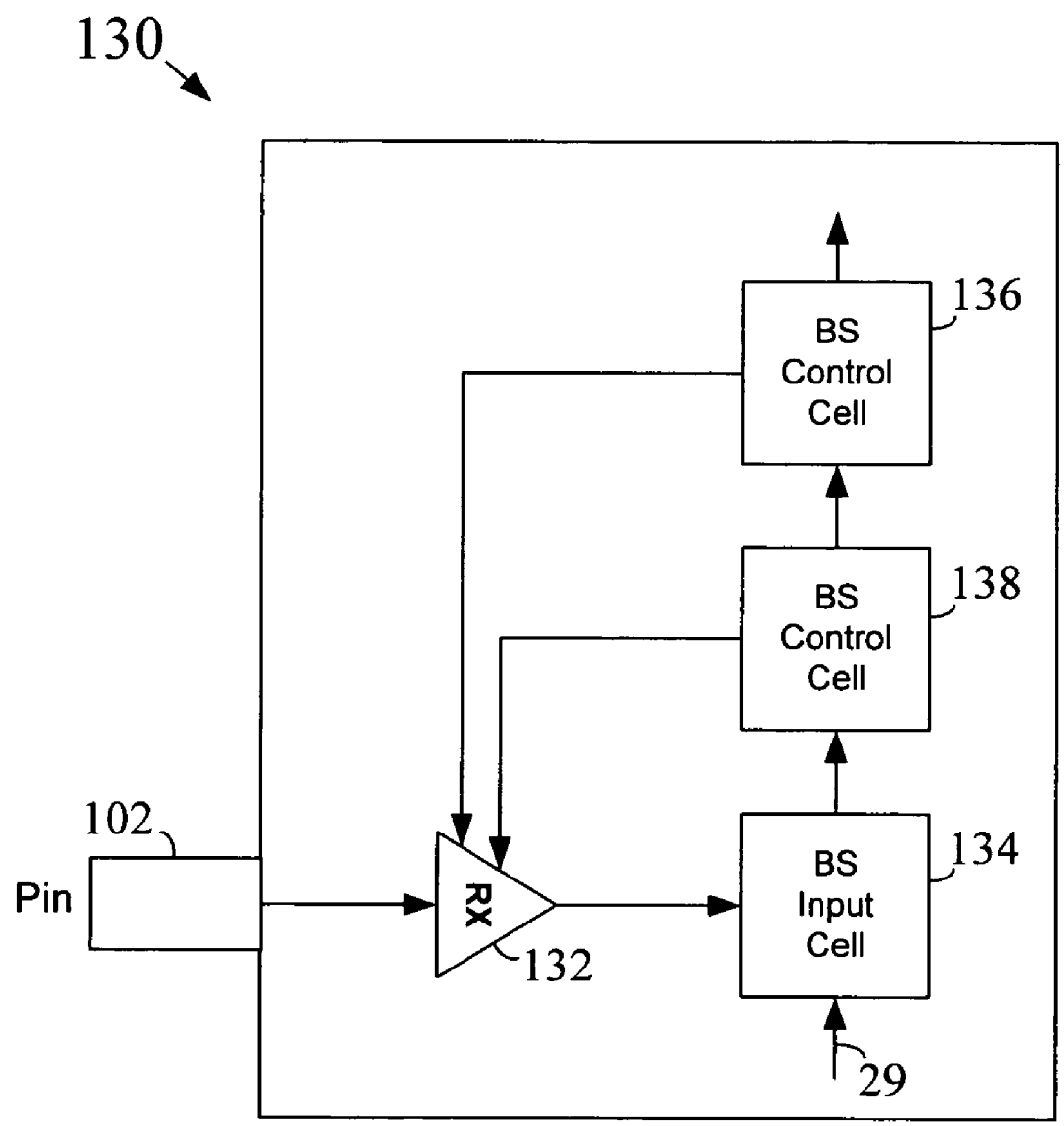
FIG. 11 is a block diagram illustrating a boundary scan input pin arrangement in accordance with another embodiment of the present invention.

FIG. 11 is a block diagram illustrating a BS input pin arrangement 130 in accordance with an embodiment of the present invention. As illustrated, the arrangement 130 includes: an input pin 102, a receiver 132, a BS input cell 134, and first and second BS control cells 136, 138. The receiver 132 receives threshold information from the first and second BS control cells 136, 138. The receiver thresholds may be pre-initialized to a desired level by, for example, an external boundary scan tester based on the expected result for the input pin 102. In the embodiment of FIG. 11, the receiver 132 has up to four thresholds and the first and second BS control cells 136, 138 control the selection of which of the four thresholds will be selected for the receiver 132. During boundary scan testing, the receiver 132 outputs intermediate signal level related information to the BS input cell 134 which may subsequently be shifted out for analysis by the external boundary scan tester. Any number of BS control cells may be used.

Figure 12:
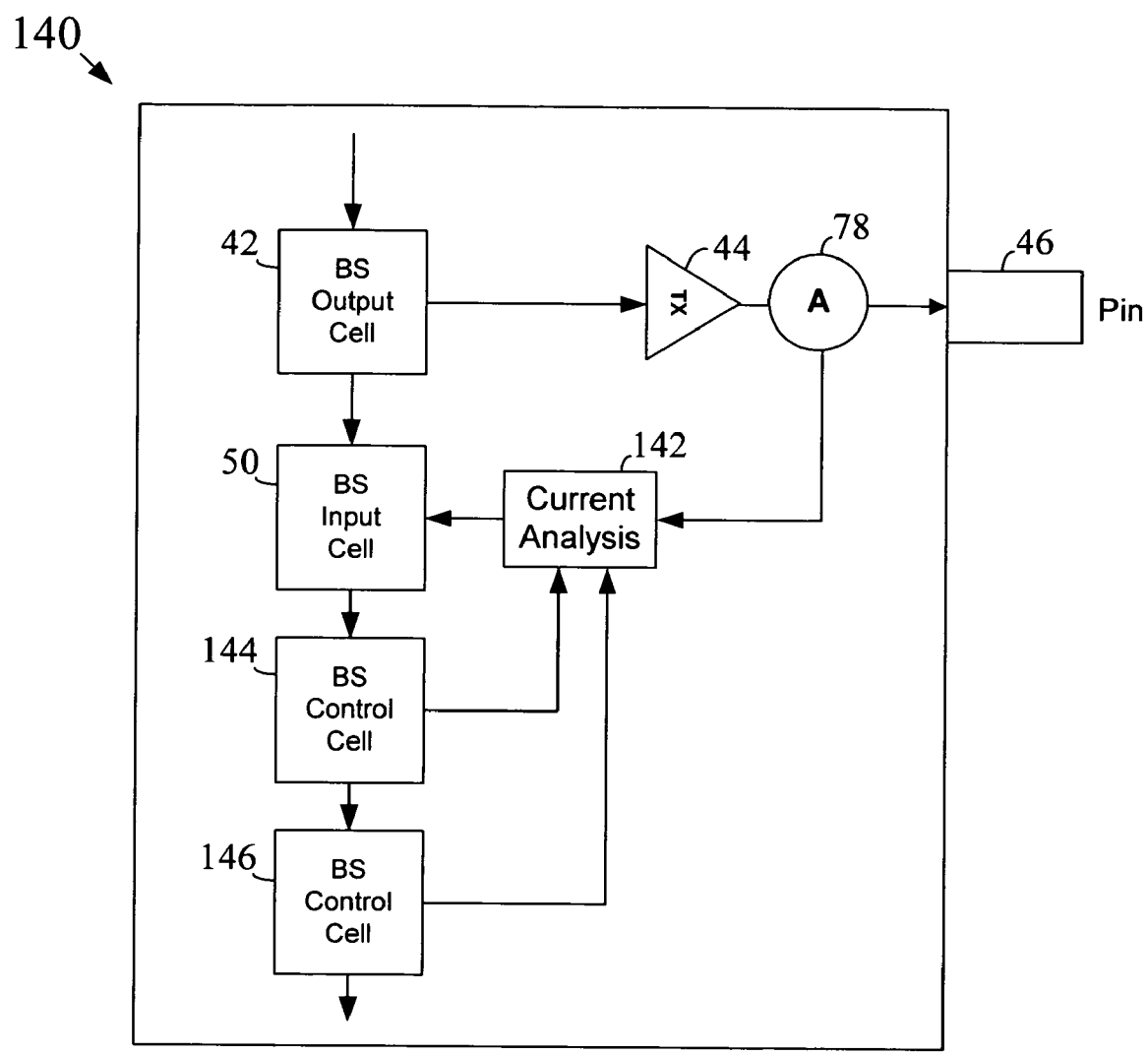
FIG. 12 is a block diagram illustrating a boundary scan output pin arrangement in accordance with another embodiment of the present invention.

FIG. 12 is a block diagram illustrating a BS output pin arrangement 140 in accordance with an embodiment of the present invention. As illustrated, the arrangement 140 includes: a BS output cell 42, a transmitter 44, a current measurement device 78, an output pin 46, a BS input cell 50, a current analysis unit 142, and first and second BS control cells 144, 146. The BS output cell 42, the transmitter 44, the output pin 46, the BS input cell 50, and the current measurement device 78 operate in substantially the same manner described previously. The current analysis unit 142 analyzes the measured current to determine whether it falls within a range that may signify the presence of a bridging fault. The current analysis unit 142 receives threshold information for use in analyzing the measured current from the first and second BS control cells 144, 146. The current analysis thresholds may be pre-initialized to a desired level by the external boundary scan tester based on the expected result for the output pin 46. Any number of BS control cells may be used.

Figure 13:
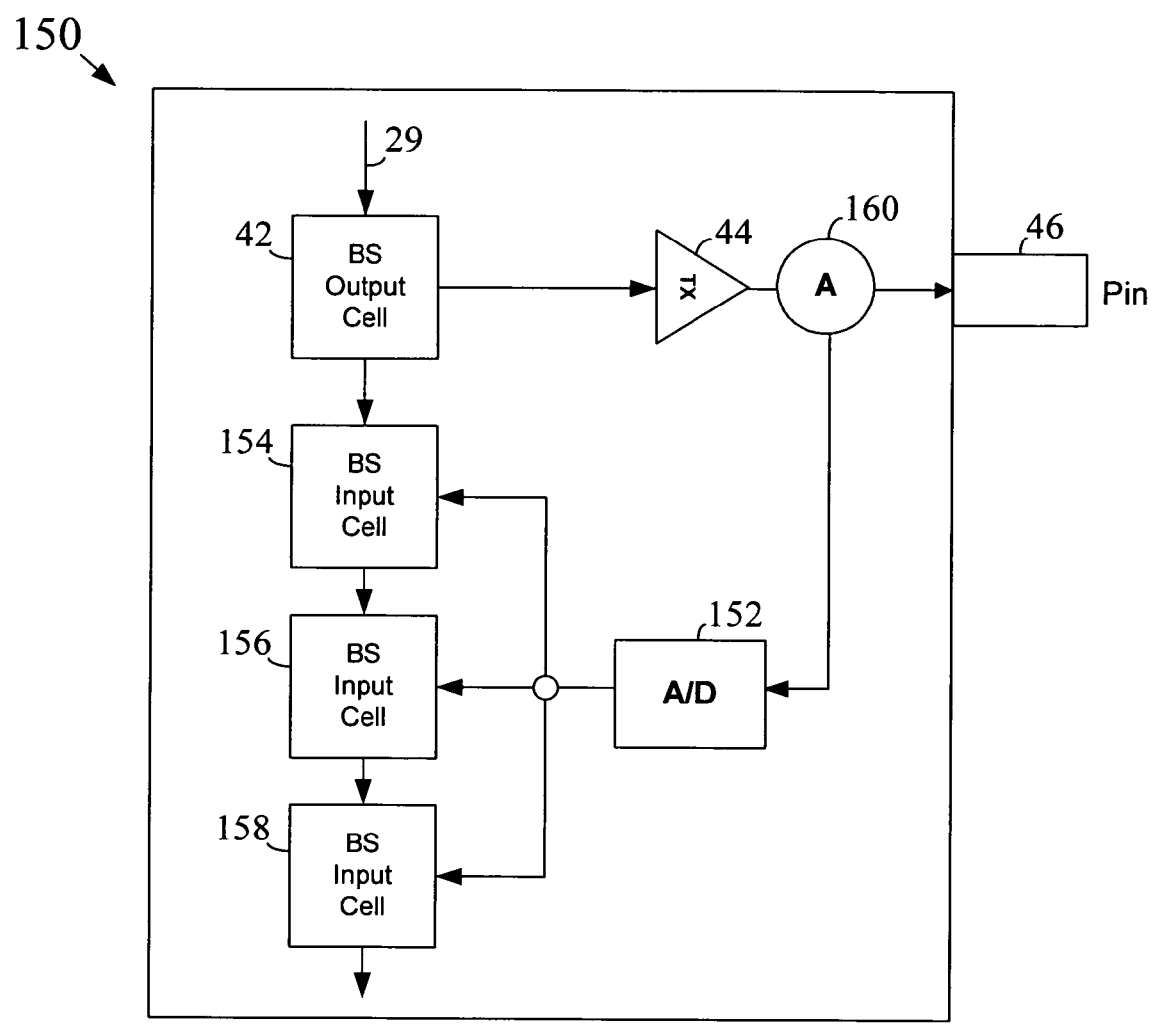
FIG. 13 is a block diagram illustrating a boundary scan output pin arrangement in accordance with another embodiment of the present invention.

FIG. 13 is a block diagram illustrating a BS output pin arrangement 150 in accordance with an embodiment of the present invention. As illustrated, the arrangement 150 includes: a BS output cell 42, a transmitter 44, an output pin 46, an A/D converter 152, first, second, and third BS input cells 154, 156, 158, and a current measurement device 160. The A/D converter 152 receives an analog current measurement from the current measurement device 160 and digitizes it to generate a multi-bit digital word. Each bit of the digital word is then delivered to a corresponding one of the first, second, and third BS input cells 154, 156, 158 (or can be read serially from a single BS input cell). The data stored within the first, second, and third BS input cells 154, 156, 158 may then be shifted out for analysis by the external boundary scan tester. This data provides the external boundary scan tester with an indication of the actual analog current level output by the transmitter 44 for use in determining whether a bridging fault may be present.

Figure 14:
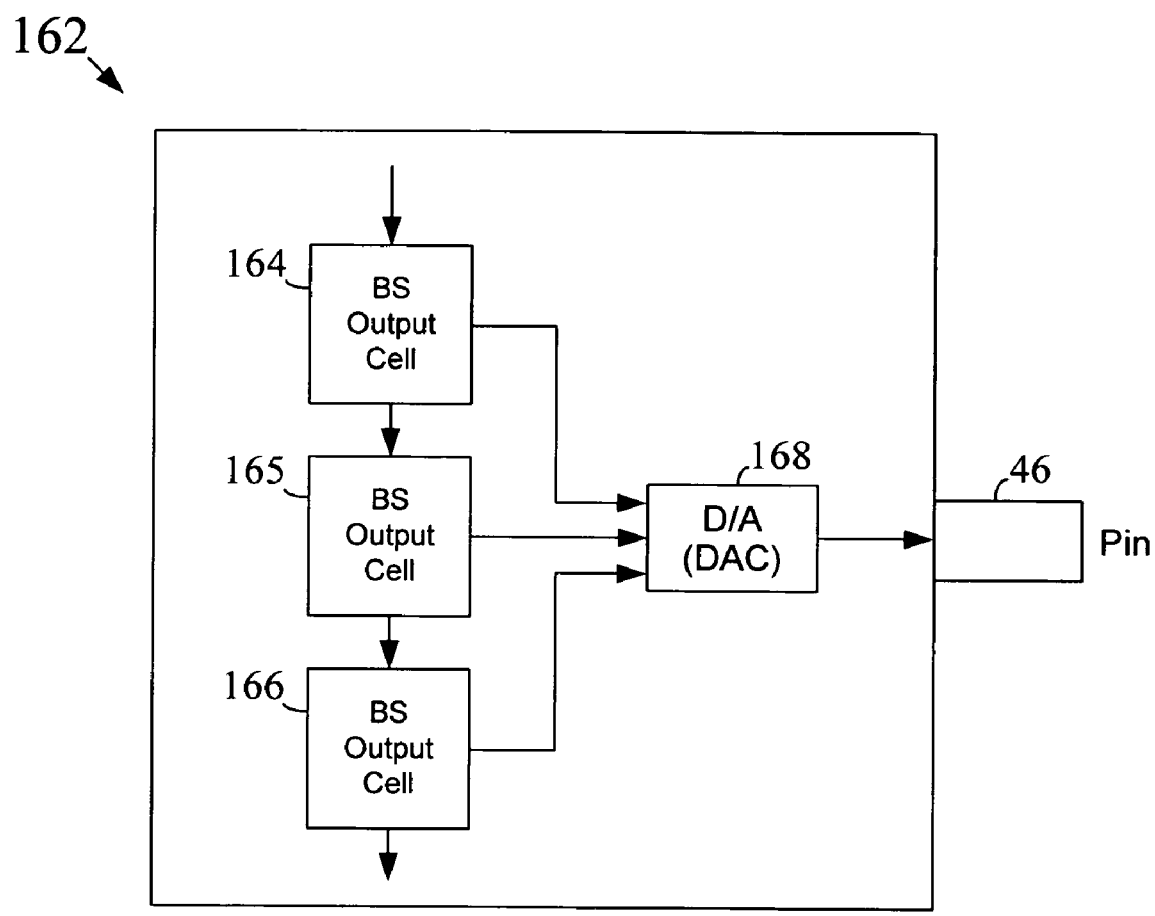
FIG. 14 is a block diagram illustrating a boundary scan output pin arrangement in accordance with another embodiment of the present invention.

FIG. 14 is a block diagram illustrating a BS output pin arrangement 162 in accordance with an embodiment of the present invention. As illustrated, the arrangement 162 includes: first, second, and third BS output cells 164, 165, 166, a digital-to-analog (D/A) converter 168, and an output pin 46. During testing, bits may be shifted into the first, second, and third BS output cells 164, 165, 166 to control the inputs to the D/A converter 168. In this manner, a boundary scan tester may test for marginal conditions on the output line by varying the level of an output driver over a range of output voltage levels. Any number of BS output cells and any number of D/A inputs may be used. Alternatively, one (or more) BS output cell(s) may be used to feed bits serially to the D/A converter 168 to control the output level.

The above described embodiments may be implemented either alone or in various combinations within boundary scan compatible devices and systems. The inventive principles may be used to detect, for example: (a) bridging faults within a single electronics assembly (e.g., a circuit card, module, board, etc.) having at least one boundary scan compatible device, (b) bridging between nets within a multi-chip module, (c) bridging between nets in a system having multiple interconnected electronic assemblies, (d) bridging between nets via series resistors, (e) bridging between nets via external cable or other shorting and/or overloading mechanism that is not necessarily within the subject electronics assembly or assemblies, (f) bridging between nets that carry direct current (DC) coupled differential signals (e.g., LVDS), (g) bridging between nets that carry alternating current (AC) coupled differential signals, and/or (e) bridging in any of a variety of other system configurations.

In some of the above-described embodiments, boundary scan test values are delivered to a device or system under test (from, for example, a boundary scan tester) via one or more boundary scan cells. It should be appreciated, however, that other methods for providing test data may alternatively be used. For example, in at least one embodiment, other dedicated discrete signals (outputs and/or inputs) are used in conjunction with (or in the place of) the TAP signals during boundary scan testing. The level of an output driver, for example, may be set by external discrete signals rather than through internal scan cells. Similarly, the level sensed by a receiver may be set by external discrete signals rather than by internal scan cells. Such signals may be provided through, for example, one or more dedicated pins or other input structures.

In the embodiments described above that include D/A or A/D converters, the digital signal at the output or input of the converter is typically shown as a parallel signal. It should be appreciated, however, that D/A and A/D converters may alternatively be used that output or input a serial stream of digital data bits. For example, with reference to FIG. 10, the A/D 122 may be replaced by a converter that outputs a serial stream of digital data bits to a single BS input cell.

Figure 15:
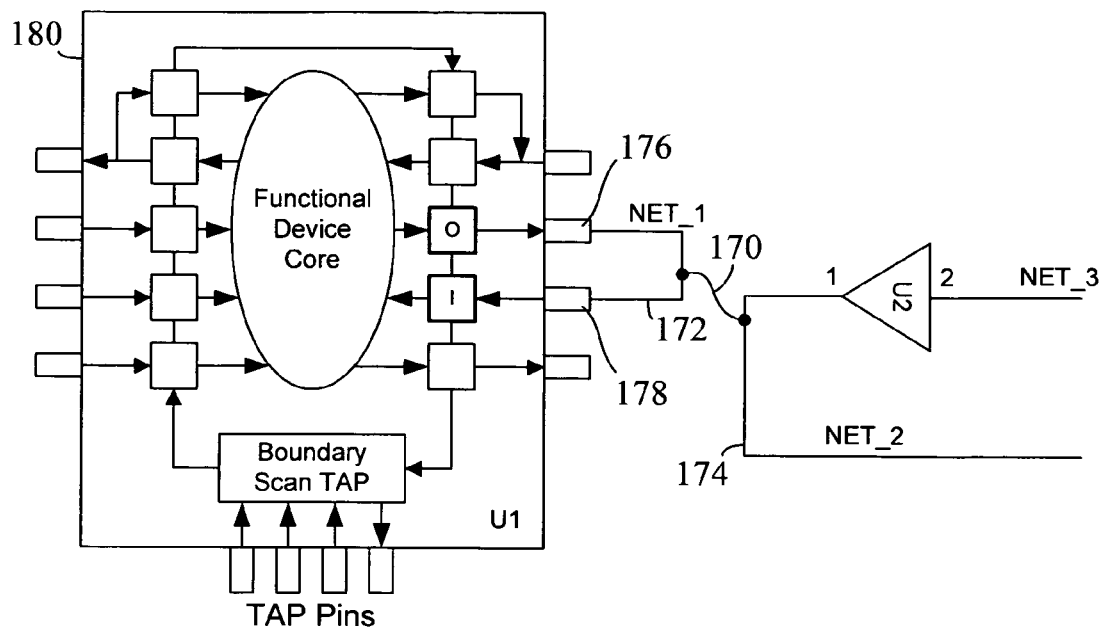
FIGS. 15, 16, 17, 18, 19, 20, and 21 are diagrams illustrating various bridging fault types that may be detected using the inventive principles.
Figure 16:
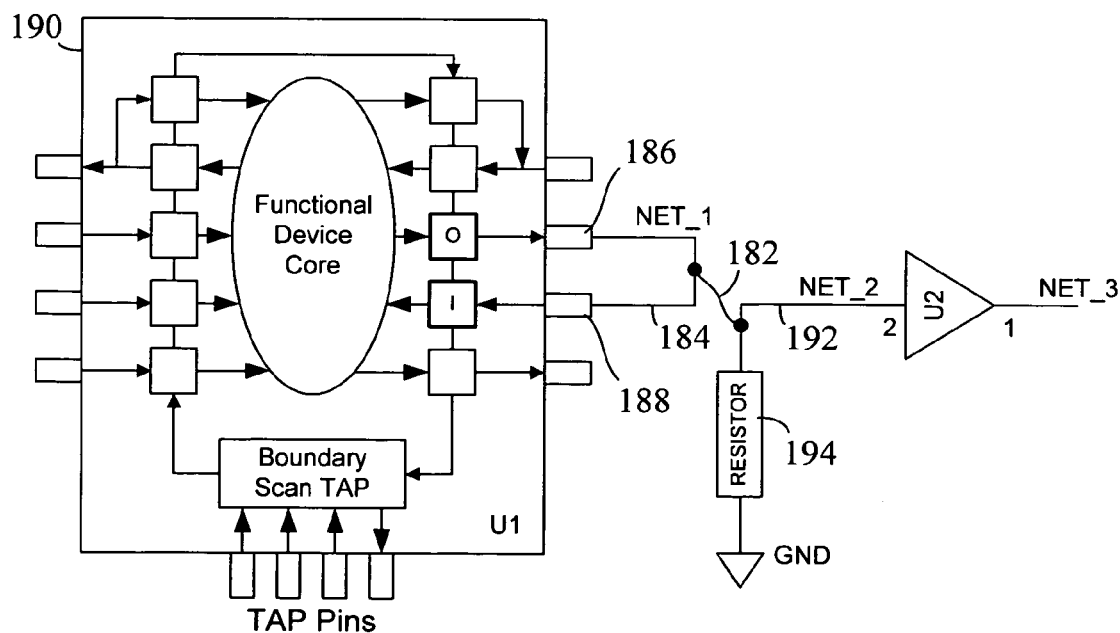
Figure 17:
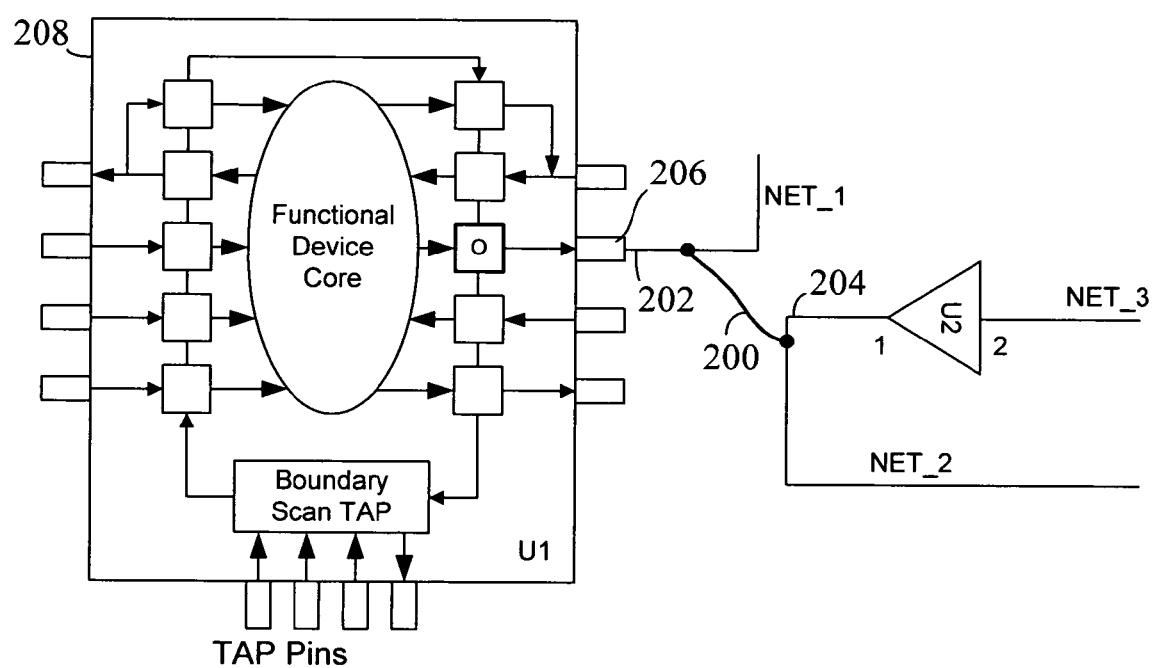
Figure 18:
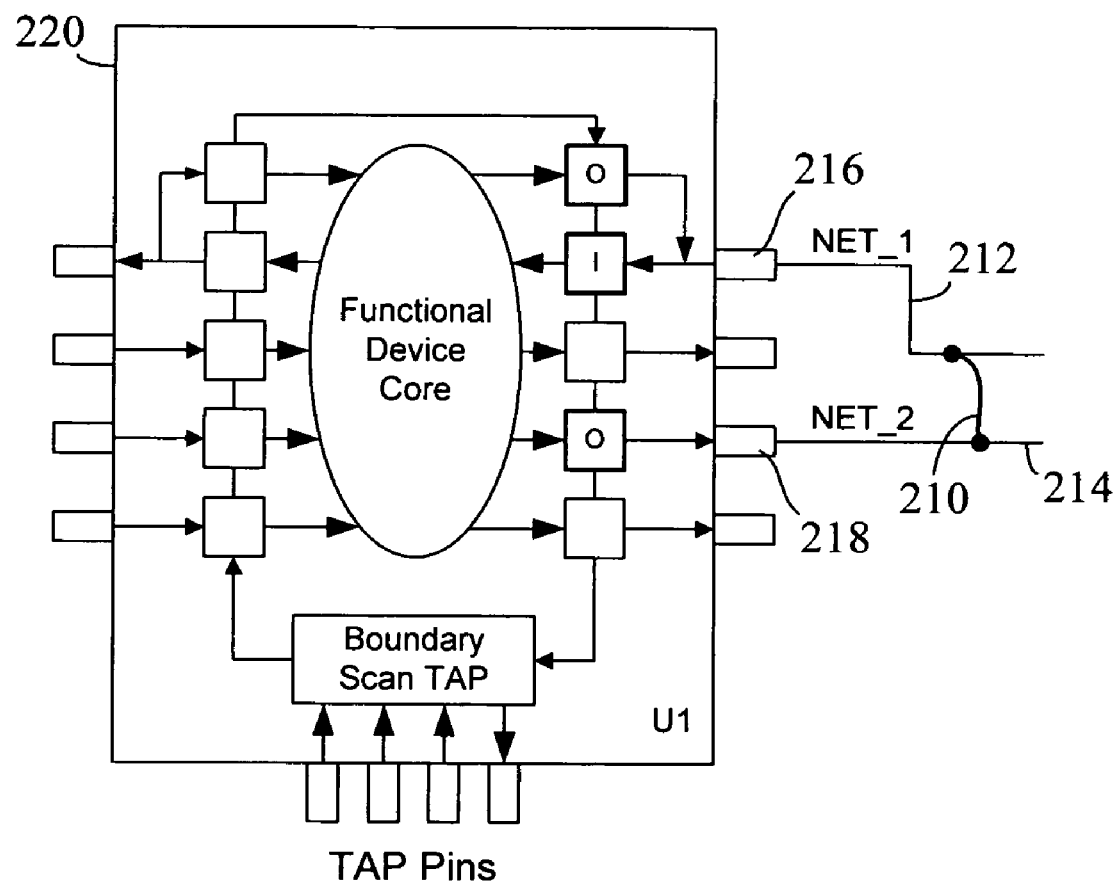
Figure 19:
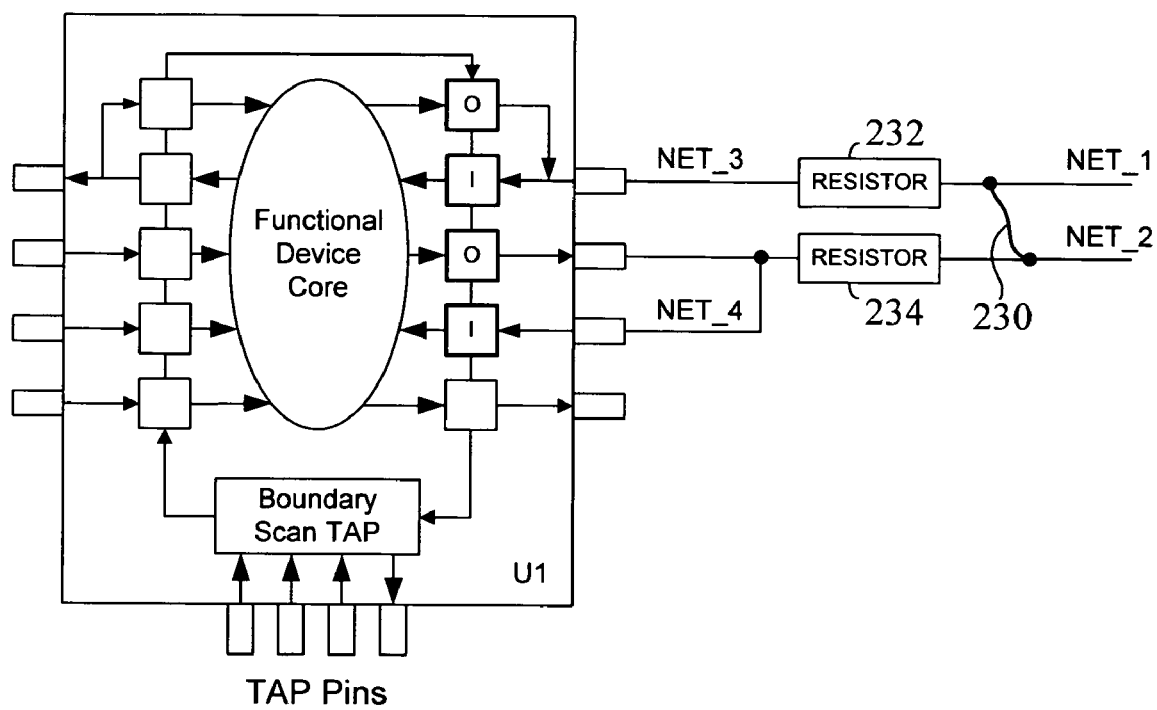
Figure 20:
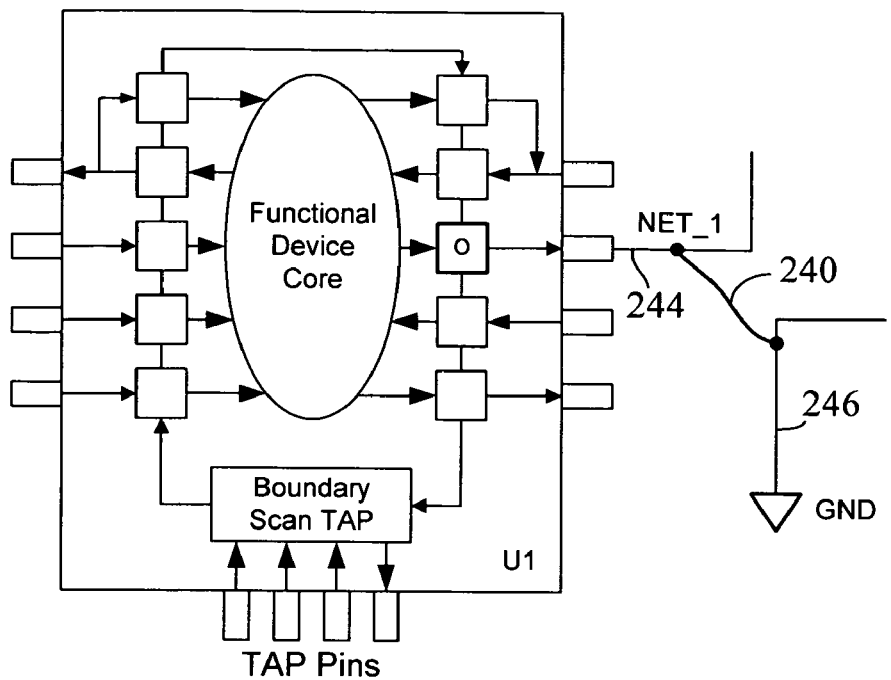
Figure 21:
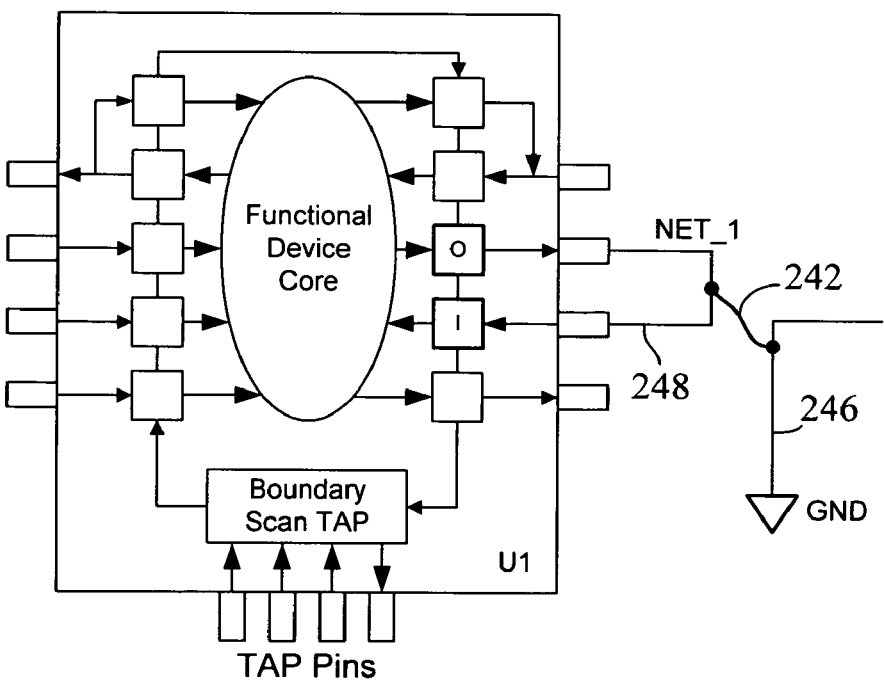

In FIG. 2, a bridging fault 38 is illustrated that occurs between two boundary scan nets (i.e., NET_3 and NET_4) that each have at least one transmitter and at least one receiver. It should be appreciated, however, that the principles of the present invention may be used to detect bridging faults in a wide variety of other scenarios in addition to the scenario of FIG. 2. FIGS. 15–21 illustrate some of the other bridging fault types that may be detected. Many others also exist. FIGS. 15 and 16 each illustrate a bridging fault between a boundary scan net having at least one transmitter and at least one receiver and a non-boundary scan net. For example, FIG. 15 illustrates a bridging fault 170 between a boundary scan net 172 (which is connected between an output pin 176 and an input pin 178 of device 180) and a non-boundary scan net 174. Similarly, FIG. 16 illustrates a bridging fault 182 between a boundary scan net 184 (which is connected between an output pin 186 and an input pin 188 of a device 190) and a non-boundary scan net 192 that is coupled to ground through a resistor 194. FIG. 17 illustrates a bridging fault 200 between a boundary scan net 202 that is coupled to at least one transmitter (associated with output pin 206 of device 208) and no receivers and a non-boundary scan net 204. FIG. 18 illustrates a bridging fault 210 between a boundary scan net 212 coupled to at least one transmitter and at least one receiver (associated with bi-directional pin 216 of device 220) and another boundary scan net 214 that is coupled to at least one transmitter (associated with output pin 218 of device 220) and no receiver. FIG. 19 illustrates a bridging fault 230 that occurs behind series resistors 232, 234. FIGS. 20 and 21 each illustrate a bridging fault between a boundary scan net and ground. That is, FIG. 20 illustrates a bridging fault 240 between a boundary scan net 244 and ground 246 and FIG. 21 illustrates a bridging fault 242 between a boundary scan net 248 and ground 246. Similar faults may exist between a boundary scan net and a power terminal. The principles of the present invention may be used to diagnose each of these fault types as well as others.

In the above description, the inventive principles are discussed in connection with the pins on the package of a device. It should be appreciated, however, that the invention is not limited to use with package pins and may be implemented with any electrical node of a device that is intended to couple data into and/or out of the device. This may include, for example, a pin on a device package, a bond pad on a microelectronic chip, etc. In at least one embodiment, for example, the inventive principles are used to detect bridging between nets within a multi-chip module that does not involve a package pin.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A boundary scan compatible digital device comprising:
an electrical node;
a first receiver having a first threshold level for use in detecting data on said electrical node;
a second receiver having a second threshold level for use in detecting data on said electrical node, wherein said second threshold level is different from said first threshold level;
a first boundary scan input cell to receive a detected data bit from said first receiver; and
a second boundary scan input cell to receive a detected data bit from said second receiver, wherein said second boundary scan input cell is different from said first boundary scan input cell.

2. The digital device of claim 1, wherein:
said first boundary scan input cell and said second boundary scan input cell are coupled to one another on a serial line, wherein said detected bits stored within said first and second boundary scan input cells are to be shifted out of said cells, along said serial line, for analysis by an external boundary scan control device coupled to said digital device to determine whether a bridging fault is likely to exist.

3. The digital device of claim 1, comprising:
at least one other receiver having a threshold level for use in detecting data on said electrical node that is different from said first and second threshold levels.

4. The digital device of claim 1, wherein:
said first and second threshold levels are selected to permit detection of intermediate signals levels that are indicative of a bridging fault.

5. A boundary scan compatible digital device comprising:
an electrical node;
a receiver having a variable threshold level, coupled to said electrical node, for use in determining whether a bridging fault exists within circuitry coupled to said digital device;
a boundary scan input cell coupled to receive and store a detected data bit output by said receiver; and
one or more boundary scan control cells to deliver digital threshold information to said receiver.

6. The digital device of claim 5, wherein:
said variable threshold level depends upon an expected digital data value on said electrical node, wherein said variable threshold level has a first value when a logic one is expected on said electrical node and a second value when a logic zero is expected on said electrical node.

7. The digital device of claim 5, wherein:
said boundary scan input cell and said at least one boundary scan control cell are connected to a serial boundary scan line, wherein said detected data bit stored within said boundary scan input cell can be shifted out of said boundary scan input cell, along said serial line, for analysis by an external boundary scan control device.

8. The digital device of claim 5, comprising:
said digital threshold information includes one bit of information from each of said one or more boundary scan control cells.

9. The digital device of claim 5, comprising:
a boundary scan test access port in communication with said one or more boundary scan control cells.

10. The digital device of claim 5, wherein:
said receiver is a read back receiver coupled to an output pin.

* * * * *